United States Patent [19]
Noguchi

[11] Patent Number: 5,307,308
[45] Date of Patent: Apr. 26, 1994

[54] SEMICONDUCTOR MEMORY DEVICE COMPRISING ONE OR MORE HIGH-RESISTANCE ELEMENTS

[75] Inventor: Takeshi Noguchi, Hyogo, Japan

[73] Assignee: Mitsubishi Denki Kabushiki Kaisha, Tokyo, Japan

[21] Appl. No.: 746,277

[22] Filed: Aug. 16, 1991

[30] Foreign Application Priority Data

Aug. 22, 1990 [JP] Japan .................................. 2-221862

[51] Int. Cl.$^5$ ...................... G11C 11/00; H01L 29/04
[52] U.S. Cl. ...................... 365/51; 365/148; 257/380; 257/381; 257/903
[58] Field of Search ...................... 365/51, 148; 357/41, 357/51, 59 F; 257/379, 380, 381, 903

[56] References Cited

U.S. PATENT DOCUMENTS

| | | | |
|---|---|---|---|
| 4,453,175 | 6/1984 | Ariizumi et al. | 357/59 |
| 4,609,835 | 9/1986 | Sakai et al. | 357/59 |
| 4,841,481 | 6/1989 | Ikeda et al. | 257/903 X |
| 4,910,576 | 3/1990 | Campbell et al. | 257/903 X |
| 5,012,443 | 4/1991 | Ema | 365/51 |
| 5,124,774 | 6/1992 | Godinho et al. | 257/380 X |

FOREIGN PATENT DOCUMENTS 0050764  3/1991  Japan .................................. 365/148

Primary Examiner—Eugene R. LaRoche
Assistant Examiner—Son Dinh
Attorney, Agent, or Firm—Lowe, Price, LeBlanc & Becker

[57] ABSTRACT

A semiconductor memory device comprises a plurality of memory cells, and each of the memory cells includes a transistor region in which one or more transistors included in the memory cell are formed and a high-resistance element region in a resistor layer overlying the transistor region in which one or more high-resistance elements are formed. The high-resistance element region has a shape different from that of the transistor region and occupies an area not larger than that of the transistor region.

6 Claims, 4 Drawing Sheets

SEMICONDUCTOR MEMORY DEVICE COMPRISING ONE OR MORE HIGH-RESISTANCE ELEMENTS

BACKGROUND OF THE INVENTION

1. Field of the Invention

The present invention relates to semiconductor memory devices, and more particularly to improvement in a memory device in which each memory cell comprises one or more high-resistance elements.

2. Description of the Background Art

Referring to FIG. 1, a circuit diagram of one example of a memory cell comprising one or more high-resistance elements is shown. The memory cell is one of the known SRAMs (Static Random Access Memories) and comprises four transistors T and two high-resistance elements $3a$. The memory cell is connected to a supply potential Vcc and a ground potential GND, and information is written into the memory cell or read therefrom through a bit line pair BL, $\overline{BL}$ in response to a signal on a word line WL.

FIG. 2 shows a top view of a part of a memory device comprising a plurality of memory cells of FIG. 1. These memory cells are arranged in a matrix on a semiconductor substrate. Four transistors in each memory cell are formed in one of rectangular transistor regions 1 on the semiconductor substrate. Two high-resistance elements $3a$ in a memory cell are formed in a high-resistance element region $2a$ of the same rectangular shape as transistor region 1 in a resistor layer overlying transistor region 1. Illustration of interconnecting lines is omitted in FIG. 2 for clarity of the drawing.

In a conventional high-resistance-load-type SRAM device having a memory capacity of less than 1 megabit, a high-resistance element region $2a$ has the same area and the same shape as those of a transistor region 1. The fact that high-resistance element region $2a$ has the same shape as that of transistor region 1 offers great advantage to designing of a SRAM device and particularly to designing of a pattern layout.

In a highly integrated high resistance load-type SRAM device having a memory capacity of more than 1 megabit, however, it is necessary to make transistor region 1 further smaller and to make high-resistance element region $2a$ also smaller in accordance with it. However, it is difficult to form a small high-resistance element with high precision in comparison with the case of forming a small transistor.

On the other hand, it is desired to form a high-resistance element $3a$ with high precision from the standpoint of the data holding characteristics, power consumption during waiting or the like of a SRAM device. For example, in a SRAM device having a memory capacity of more than 1 megabit, while one high-resistance element $3a$ is designed to have one target resistance value within a range of 3 to 30T$\Omega$, the resistance value of an actually formed high-resistance element $3a$ must be controlled so as not to include an error exceeding approximately ±20%.

A high-resistance element $3a$ is normally formed of polycrystalline silicon film. The resistance value of high-resistance element $3a$ is controlled mainly by controlling its thickness, length, width and so on. However, the following problems (1)–(3) arose in the case of forming a high-resistance element $3a$ having a high resistance value within the range of 3-30T$\Omega$ with high precision.

(1) If the thickness of polycrystalline silicon is made smaller in order to increase the resistance value, variations in the resistance value increase suddenly.

(2) If the length of high-resistance element $3a$ is increased in order to increase the resistance value, high-resistance element region $2a$ becomes larger, and the area occupied by one memory cell becomes larger.

(3) Reduction in the width of high-resistance element $3a$ for increasing the resistance value is limited by precision of pattern transcription.

SUMMARY OF THE INVENTION

In view of the above described prior art, an object of the present invention is to enhance the degree of integration of a memory device in which each memory cell includes one or more high-resistance elements.

Each of a plurality of memory cells included in a semiconductor memory device according to the present invention includes a transistor region where one or more transistors included in the memory cell are formed and a high-resistance element region in a resistor layer overlying the transistor region where one or more high-resistance elements are formed, and the high-resistance element region has a shape different from that of the transistor region and occupies an area not larger than that of the transistor region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
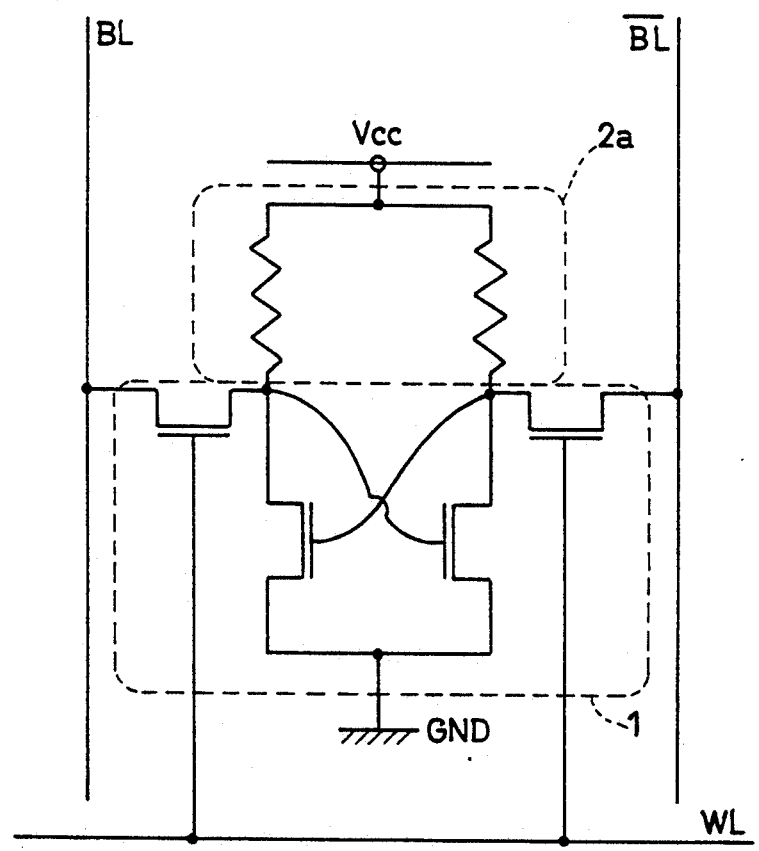
FIG. 1 is a circuit diagram illustrating an example of a SRAM cell.
Figure 2:
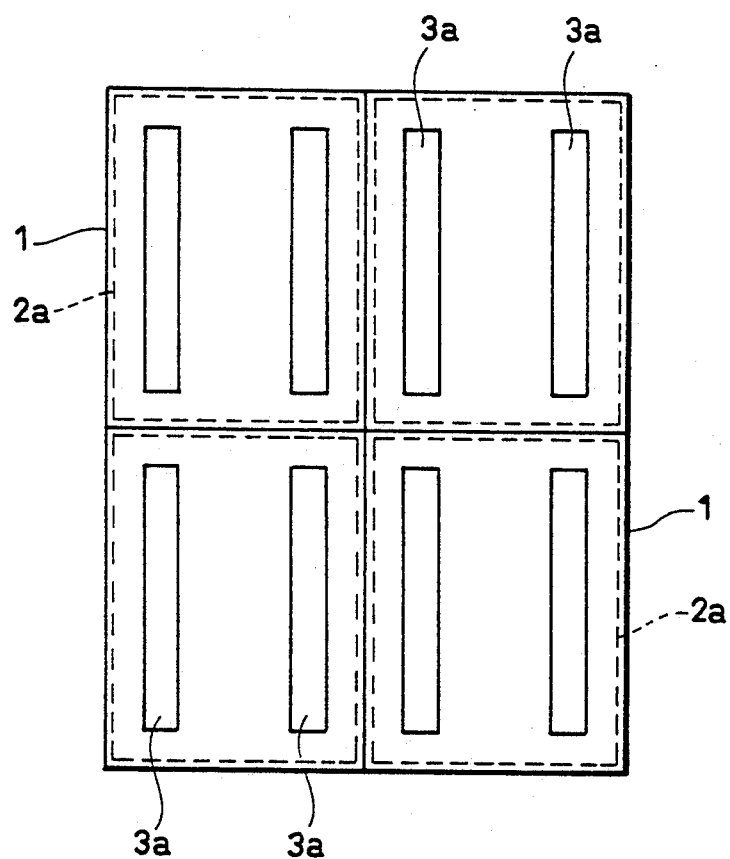
FIG. 2 is a partial schematic top view of a semiconductor memory device including a plurality of SRAM cells of FIG. 1.
Figure 3:
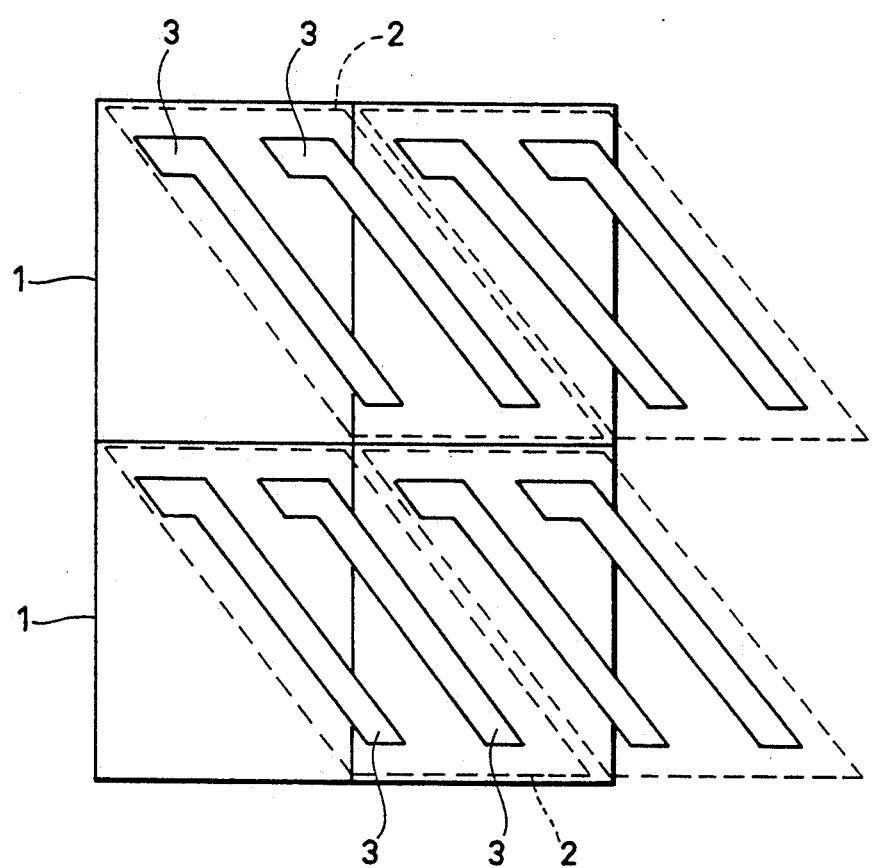
FIG. 3 is a partial schematic top view of a semiconductor memory device according to a first embodiment of the present invention.

Referring to FIG. 3, a part of a semiconductor memory device according to a first embodiment of the present invention is shown in a schematic top view. The semiconductor memory device includes a plurality of memory cells arranged in a matrix. Each memory cell may be formed in a circuit equivalent to a circuit shown in the circuit diagram in FIG. 1. In that case, four transistors are formed in one of transistor regions 1. On the other hand, a high-resistance element region 2 over transistor region 1 has a shape different from that of transistor region 1 to make it possible that each high-resistance element 3 is formed with high precision to have a longer effective length in comparison with a conventional high-resistance element $3a$. It will be readily understood that although high-resistance element region 2 has a shape different from that of transistor region 1, each high-resistance element region 2 has substantially the same area as that of each transistor region 1. Specifically, even if the degree of integration of a semiconductor memory device is enhanced to reduce the area of a transistor region 1, it is possible to form with precision a high-resistance element 3 with high reliability having a sufficient length in a high-resistance element region 2 having the same area as that of transistor region 1. As a result, it is possible to obtain a semiconductor memory device with high reliability.

Figure 4:
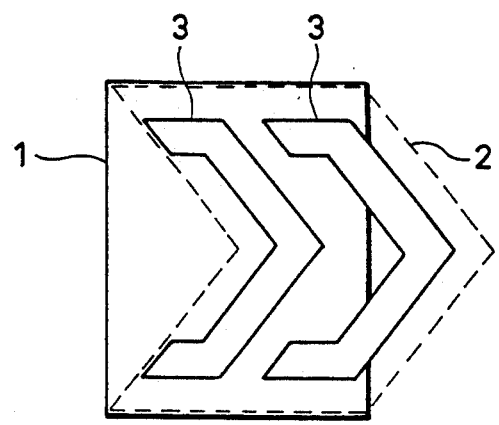
FIG. 4 is a schematic top view of one of memory cells included in a semiconductor memory device according to a second embodiment of the present invention.

Referring to FIG. 4, one memory cell in a semiconductor memory device according to a second embodiment of the present invention is shown. Although a high-resistance element region 2 has substantially the same area as that of a transistor region 1, it has a shape different from that of transistor region 1 also in this memory cell, and this makes it possible that high-resistance element 3 is formed to extend long with high precision.

Figure 5:
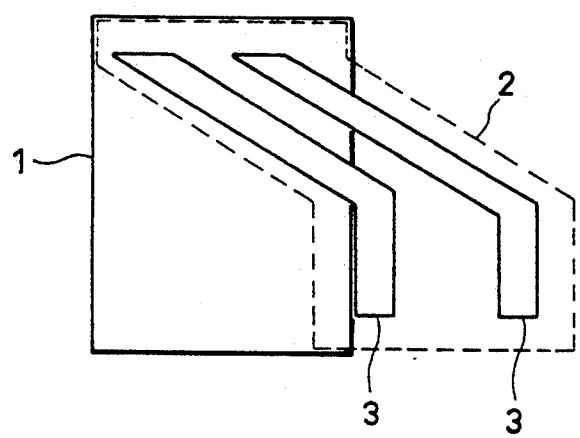
FIG. 5 is a schematic top view of one of memory cells included in a semiconductor memory device according to a third embodiment of the present invention.

Referring to FIG. 5, one memory cell in a semiconductor memory device according to a third embodiment of the present invention is shown. According to the third embodiments, it is also possible to form a high-resistance element 3 having a sufficient length with precision in a high-resistance element region 2 having substantially the same area as that of a transistor region 1 but having a shape different from that of transistor region 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a plurality of memory cells, each of said memory cells including:
    a transistor region having one or more transistors; and
    a high-resistance element region associated with the same memory cell as said transistor region in a resistor layer overlying said transistor region and having one or more high-resistance elements;
    said high-resistance element region projecting beyond said transistor region and occupying an area not larger than that of said transistor region.

2. The semiconductor memory device according to claim 1, wherein said semiconductor memory device comprises SRAM device.

3. The semiconductor memory device according to claim 1, wherein said high-resistance element is formed of a polycrystalline silicon film.

4. The semiconductor memory device according to claim 1, wherein said transistor is formed on a semiconductor substrate.

5. The semiconductor memory device according to claim 1, wherein said high-resistance element region is formed on an interlayer insulating film formed on said transistor region.

6. The semiconductor memory device according to claim 1, wherein said high-resistance element region has a shape different from that of said transistor area.

* * * * *